(12) United States Patent
Ware et al.

(10) Patent No.: US 11,109,512 B2
(45) Date of Patent: Aug. 31, 2021

(54) MEMORY SUBSYSTEM FOR A CRYOGENIC DIGITAL SYSTEM

(71) Applicant: Rambus Inc., Sunnyvale, CA (US)

(72) Inventors: Frederick A. Ware, Los Altos Hills, CA (US); John Eric Linstadt, Palo Alto, CA (US); Thomas Vogelsang, Mountain View, CA (US)

(73) Assignee: RAMBUS INC., San Jose, CA (US)

( * ) Notice: Subject to any disclaimer, the term of this patent is extended or adjusted under 35 U.S.C. 154(b) by 0 days.

(21) Appl. No.: 16/634,531

(22) PCT Filed: Jul. 23, 2018

(86) PCT No.: PCT/US2018/043263
§ 371 (c)(1),
(2) Date: Jan. 27, 2020

(87) PCT Pub. No.: WO2019/027707
PCT Pub. Date: Feb. 7, 2019

(65) Prior Publication Data
US 2021/0096616 A1   Apr. 1, 2021

Related U.S. Application Data

(60) Provisional application No. 62/539,844, filed on Aug. 1, 2017.

(51) Int. Cl.
*G06F 1/20* (2006.01)
*H05K 7/20* (2006.01)
*H01L 27/108* (2006.01)
*H01L 23/367* (2006.01)

(52) U.S. Cl.
CPC .......... *H05K 7/20372* (2013.01); *G06F 1/20* (2013.01); *H01L 23/3677* (2013.01); *H01L 27/108* (2013.01)

(58) Field of Classification Search
CPC ..... G06F 1/20; H01L 23/3677; H01L 27/108; H05K 7/20372
See application file for complete search history.

(56) References Cited

U.S. PATENT DOCUMENTS

| 7,243,507 B2 * | 7/2007 | Shapiro .............. H05K 7/20372 62/259.2 |
| 9,520,180 B1 * | 12/2016 | Mukhanov ............... A61K 8/20 |
| 2002/0169079 A1 | 11/2002 | Suzuki et al. |
| 2008/0103634 A1 | 5/2008 | Santos et al. |

(Continued)

OTHER PUBLICATIONS

Notification Concerning Transmittal of International Preliminary Report on Patentability dated Feb. 12, 2020 re: Int'l Appln. No. PCT/US18/043263. 10 Pages.

(Continued)

*Primary Examiner* — Zachary Pape
(74) *Attorney, Agent, or Firm* — Lowenstein Sandler LLP

(57) ABSTRACT

The embodiments herein describe technologies of cryogenic digital systems with a first component located in a first non-cryogenic temperature domain, a second component located in a second temperature domain that is lower in temperature than the first cryogenic temperature domain, and a third component located in a cryogenic temperature domain that is lower in temperature than the second cryogenic temperature domain.

22 Claims, 9 Drawing Sheets

(56) References Cited

U.S. PATENT DOCUMENTS

| | | |
|---|---|---|
| 2012/0091729 A1 | 4/2012 | Nash |
| 2015/0257310 A1 | 9/2015 | DeSouza et al. |
| 2017/0060202 A1 | 3/2017 | Sundaram et al. |
| 2017/0090533 A1 | 3/2017 | Ware et al. |
| 2019/0392341 A1* | 12/2019 | Leipold .................. G06F 15/16 |

OTHER PUBLICATIONS

Notification of Transmittal of the International Search Report and the Written Opinion of the International Searching Authority, or the Declaration dated Oct. 12, 2018 re: Int'l Appln. No. PCT/US18/043263. 16 Pages.

* cited by examiner

MEMORY SUBSYSTEM FOR A CRYOGENIC DIGITAL SYSTEM

RELATED APPLICATIONS

This application claims the benefit under 35 U.S.C. § 371 of International Patent Application No. PCT/US18/43263, filed Jul. 23, 2018, which claims the benefit of U.S. Provisional Application No. 62/539,844, filed Aug. 1, 2017, the entire contents of all are incorporated by reference in their entirety.

BACKGROUND

Cryogenic systems may contain circuits that require voltage and current to be transferred from one temperature domain to a lower temperature domain. For example, the electronic system may include a first temperature domain at 300 Kelvin (K) and a second temperature domain at 4K. There are other temperature domains that may be used as the second temperature domain Heat flow to the second temperature domain in a cryogenic digital system is a concern. To pull the heat out at a cryogenic temperature domain, such as by a cooling subsystem, there is a large efficiency factor that affects the amount of energy at room temperature needed.

BRIEF DESCRIPTION OF THE DRAWINGS

The present disclosure is illustrated by way of example, and not by way of limitation, in the figures of the accompanying drawings.

DETAILED DESCRIPTION

The embodiments herein describe technologies of cryogenic digital systems with a first component, like a memory subsystem, in a first cryogenic temperature domain (e.g., 77K) and a second component, like a processor, in a second cryogenic temperature domain (e.g., 4K) that is less than the first cryogenic temperature domain. The embodiments herein also describe technologies of cryogenic digital systems, such as a computer system with a memory subsystem having memory components in a first temperature domain (e.g., 273K) and memory buffer components (also referred to herein as just buffer components or buffer logic circuits) in a second temperature domain (e.g., 77K) and a processing system in a third temperature domain (e.g., 4K), where the second temperature domain is lower in temperature than the first temperature domain and the third temperature domain is lower in temperature than the second temperature domain. In one embodiment, the second temperature domain is a first cryogenic temperature and the third temperature domain is a second cryogenic temperature that is less than the first cryogenic temperature domain. It should be noted that the U.S. National Institute of Standards and Technology defines cryogenic temperatures as being temperatures below 93.15K (−180° Celsius, −292° Fahrenheit), however, others have defined cryogenic temperatures as being below 123K. In some embodiments, a first component is in a first temperature domain that is above cryogenic temperatures, a second component is in a second temperature domain that is lower than the first temperature domain, and a third component is in a third temperature domain that is lower than the second temperature domain.

Figure 1:
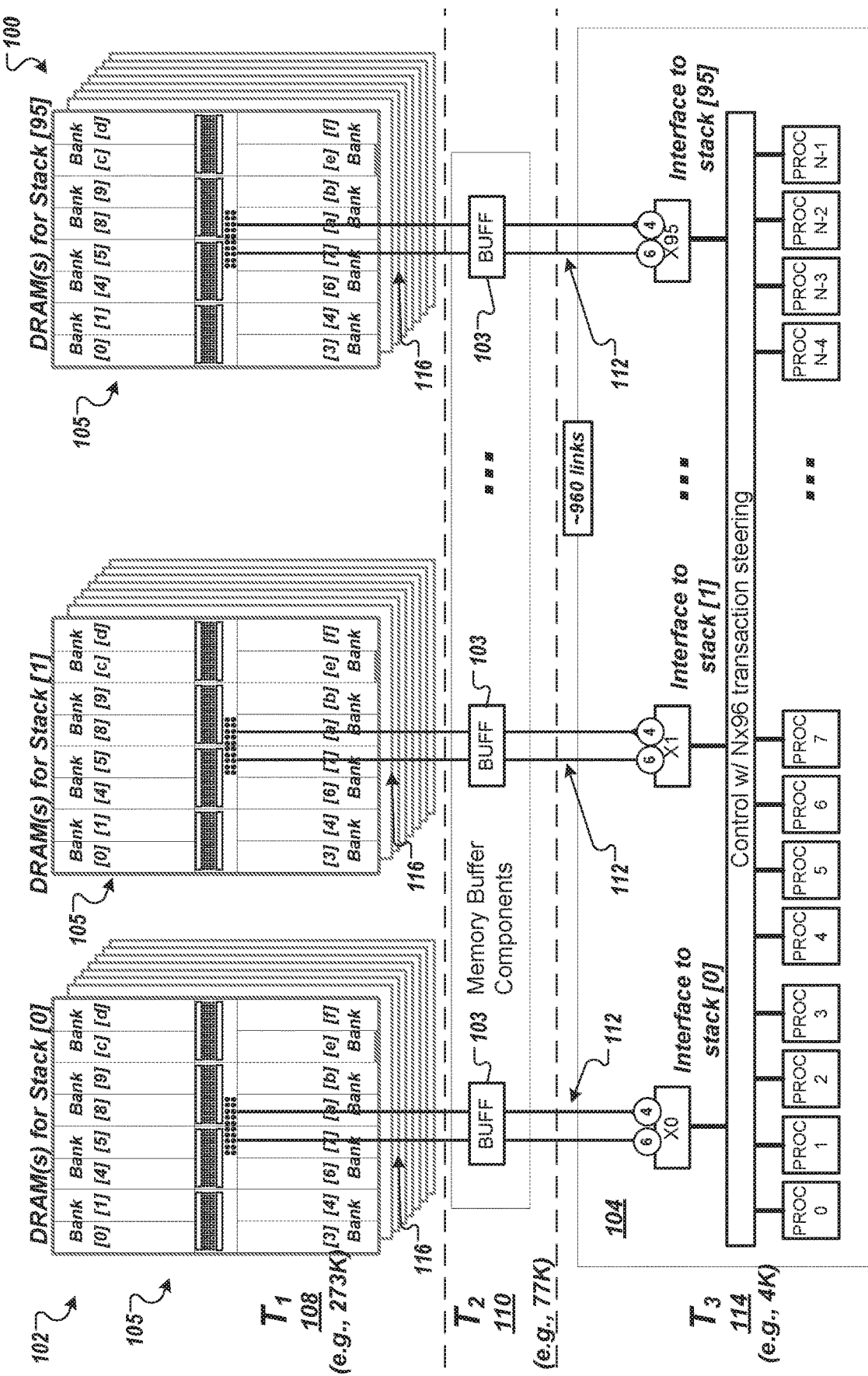
FIG. 1 is a block diagram of a cryogenic digital system with a memory subsystem, having memory buffer components in a first temperature domain and memory components in a second temperature domain, and a processing system in a third temperature domain according to one embodiment.

FIG. 1 is a block diagram of a cryogenic digital system 100 with a memory subsystem 102, having memory components 105 in a first temperature domain 108 ($T_1$) and memory buffer components 103 in a second temperature domain 110 ($T_2$), and a processing system 104 in a third temperature domain 114 ($T_3$) according to one embodiment. The cryogenic digital system 100 includes a first temperature domain 108 ($T_1$), a second temperature domain 110 ($T_2$) (a first cryogenic temperature domain), and a third temperature domain 114 ($T_3$) (a second cryogenic temperature domain). The first temperature domain 108 ($T_1$) may be 273K. In another embodiment, the first temperature domain 108 ($T_1$) is approximately 123K or above. The second temperature domain 110 ($T_2$) may be 77K. In another embodiment, the second temperature domain 110 ($T_2$) may be 123K or less. The third temperature domain 114 ($T_3$) may be 4K. In another embodiment, the third temperature domain 114 ($T_3$) is less than 77K. Alternatively, other cryogenic and non-cryogenic temperatures may be used for the first temperature domain 108 ($T_1$). The second temperature domain may be cryogenic or non-cryogenic, but the first temperature domain is greater than the second temperature domain and does not overlap in temperature.

The memory subsystem 102 is located in both the first temperature domain 108 ($T_1$) and the second temperature domain 110 ($T_2$). The memory subsystem 102 includes multiple stacks of multiple Dynamic Random Access Memory (DRAM) devices located in the first temperature domain 108 ($T_1$). Multiple DRAM devices can be disposed on one or more substrates. The memory subsystem 102 also includes multiple buffer components 103 located in the second temperature domain 110 ($T_2$) that is lower in temperature than the first temperature domain. The first temperature domain 108 ($T_1$) may be greater in temperature than cryogenic temperatures (i.e., greater than 93.15K), including ambient temperatures. The second temperature domain 110 ($T_2$) may be a cryogenic temperature (i.e., less than 93.15K). Alternatively, the second temperature domain 110 ($T_2$) may be a non-cryogenic temperature, but less than the first temperature domain 108 ($T_1$). For example, the first temperature domain 108 ($T_1$) may be 273K and the second temperature domain 110 ($T_2$) may be less than 273K. The first temperature domain 108 ($T_1$) and the second temperature domain 110 ($T_2$) may not overlap in temperature ranges. Alternatively, other cryogenic and non-cryogenic temperatures may be used for the first temperature domain 108 ($T_1$) and the second temperature domain 110 ($T_2$).

The processing system 104 is located in the third temperature domain 114 ($T_3$). The processing system 104 may include any type of electronic component or integrated circuit device or devices. In the depicted embodiment, the processing system 104 may include multiple interfaces to the multiple stacks in the memory subsystem 102, multiple processor cores, and transaction steering logic coupled between the interfaces and the processor cores. In one embodiment, the interfaces of the processing system are coupled to the memory subsystem 102 via multiple links 112, such as 960 links. For example, the multiple links 112 can connect the multiple interfaces of the processing system 104 to the multiple buffer components 103 in the second temperature domain 110 ($T_2$) and the multiple buffer components 103 can connect to the multiple stacks in the memory subsystem 102. Although the processing system 104 is illustrated with multiple processor cores, in other embodiments, the processing system may be a single processor, a System on Chip (SoC) device including one or more cores, a controller, or other types of processing devices. As referred to herein, the processing system 104 has execution logic circuits, execution logic circuits (e.g., Josephson Junction logic), a processor, a processing component, as well as a component in a cryogenic temperature domain. The component is intended to include or be representative of any type of integrated circuit component including, for example and without limitation, integrated circuit devices or buffer/bridge devices having high speed serial links, chips such as processors, system on chip (SOC), field programmable gate arrays (FPGA), application specific integrated circuits (ASIC), or the like. As referred to herein, the memory subsystem 102 has memory buffer components and memory components that may be located in two different temperature domains. At least the memory components are located in a non-cryogenic temperature domain and is intended to include or be representative of any type of integrated circuit component including, for example and without limitation, integrated-circuit memory devices of various types (e.g., dynamic random access memory (DRAM), static random access memory (SRAM), and any of the numerous types of non-volatile memory, including Flash memory, phase-change memory, magneto-resistive memory, etc.), integrated-circuits having a memory control function (e.g., dedicated memory controllers, processors, chipset components, etc.) or any other type of integrated circuit device in the respective temperature domain. The memory buffer components may be located an intervening temperature domain between the cryogenic temperature domain in which the processing system 104 is located and the non-cryogenic temperature domain in which the memory components are located.

As illustrated in FIG. 1, links 112, 116 are coupled between the memory subsystem 102 in the first temperature domain 108 and second temperature domains 110 and the processing system 104 in the third temperature domain 114 ($T_3$). Each link may be a pair of conductors (or a single conductor) on which a signal is carried between the memory components of the memory subsystem 102 and the components of the processing system 104. It should be noted that although various embodiments described herein are described as a pair of conductors, the embodiments also apply to a single conductor, like a wire. It should be noted that a return path (e.g., via a ground plane) could be shared by other single conductors, for example. A cooling assembly (not illustrated in FIG. 1) may be coupled to the links 112. Additional details of the memory subsystem 102 are described in more detail below with respect to FIGS. 5-9. In some embodiments, the links 112, 116 are part of an interconnection, such as illustrated and described with respect to FIGS. 2 and 5.

In one embodiment, the processing system 104 and the memory subsystem 102 are part of a cryogenic computer. It should be noted that in some cases the processing system 104 can include a transmitter (e.g., a memory controller) that sends a signal to a receiver in the memory subsystem 102 over a link 112, such as in a write operation. In one embodiment, the memory buffer components 103 each include a receiver that is coupled to a link 112 and a transmitter that is coupled to a link. The memory components 105 may each include a receiver that is coupled to a link 116. In a further embodiment, the memory subsystem 102 includes a transmitter that sends a signal to a receiver in the processing system 104 over a link, such as in a read operation. In one embodiment, the memory components 105 may each include a transmitter that is coupled to a link 116. The memory buffer components 103 each include a receiver that is coupled to a link 116 and a transmitter that is coupled to a link 112.

It should be noted that various embodiments described herein "first," "second," and "third" with respect to various terms, such as temperature domains, temperature ranges, components, or the like. These "first," "second," and "third" are used to distinguish between multiples items and should not be taken in the ordinal sense of these words. Also, in some embodiments, a particular component or temperature may be described as a first, but in another embodiment, the same or similar component may be described as a second or a third.

Figure 2:
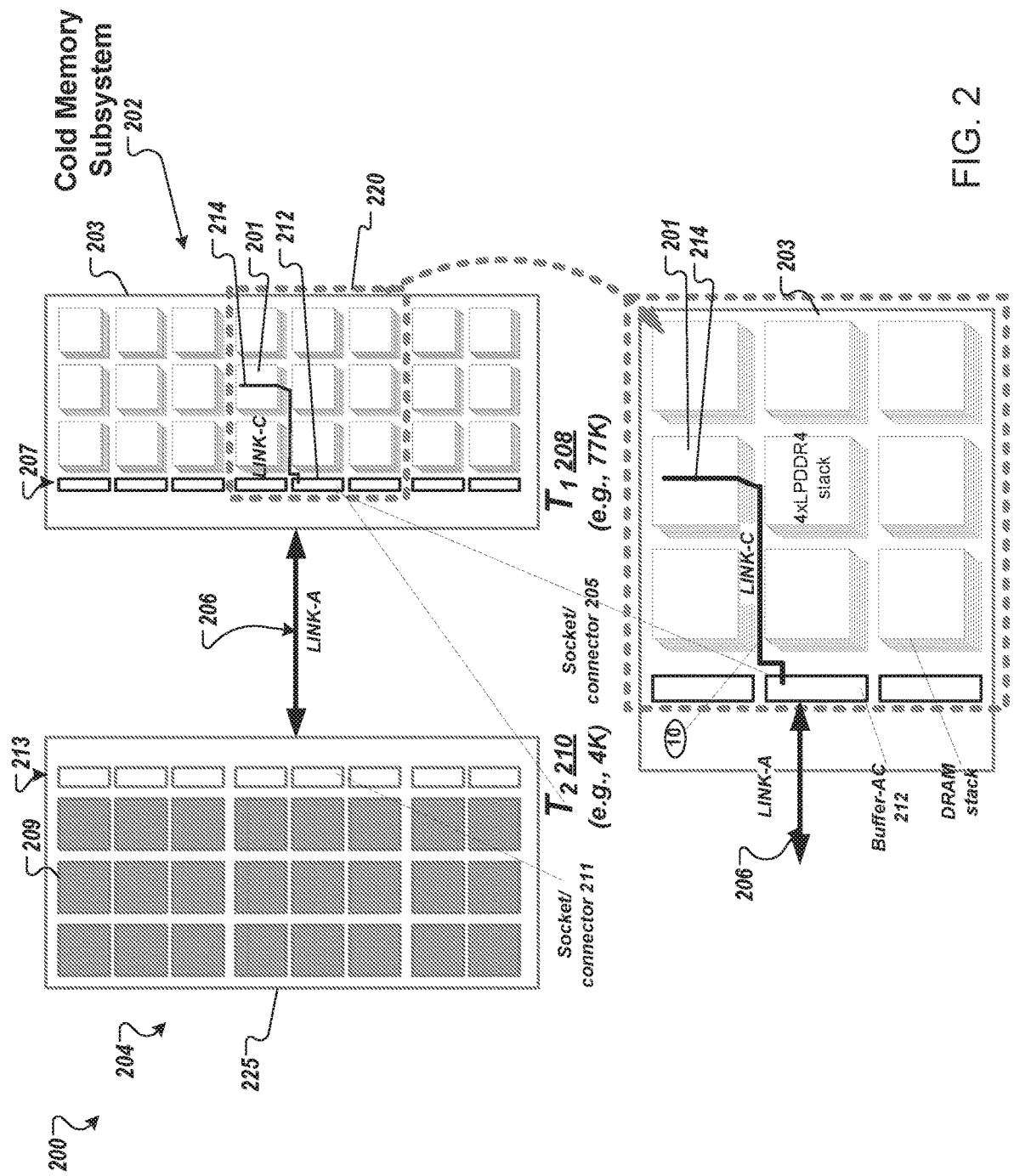
FIG. 2 is a block diagram of a cryogenic digital system with a cold memory subsystem, a processing system, and an interconnection coupled between the cold memory subsystem and the processing system according to one embodiment.

FIG. 2 is a block diagram of a cryogenic digital system 200 with a cold memory subsystem 202, a processing system 204, and an interconnection 206 coupled between the cold memory subsystem 202 and the processing system 204 according to one embodiment. In some embodiments, the interconnection 206 can include a socketed attachment to the processing system 204 and circuit boards of the cold memory subsystem 202. Alternatively, the interconnection 206 can be other forms of interconnection, such as directly bonded attachments, or the like. The memory subsystem 202 includes multiple DRAM stacks 201 disposed on a front surface of a substrate 203. The DRAM stacks 201 are coupled to a connector 205 (e.g., socket connector) in an interface region 207 on the front surface of the substrate 203. The DRAM stacks 201 may be 4xLPDDR4 stacks. Alternatively, other memory components may be used at the respective device sites and the memory component may be a single memory component at the respective device site, a die-stacked memory component, a package-stacked memory component, or the like. The processing system 204 includes one or more integrated circuits 209, such as processors, processor cores, SoCs, or the like. The integrated circuits 209 are coupled to a connector 211 (e.g., socket connector) in an interface region 213 on a front surface of a substrate 225. The interconnection 206 is coupled between the connector 205 and the connector 211. The interconnection 206 is labeled LINK-A in FIG. 2. The interconnection 206 (LINK-A) is coupled to a memory buffer component 212 via the connector 205. It should be noted that only one interconnection 206 is illustrated in FIG. 2, but there may be one interconnection 206 for each memory buffer component 212. Alternatively, one interconnection 206 may be coupled to a socket connector that is coupled to one or more buffer components 212. The memory buffer component 212 is coupled to interconnections to the DRAM stacks 201, such as illustrated by link 214 between the memory buffer component 212 and one of the DRAM stacks 201; the link 214 is labeled as LINK-C. The memory buffer component 212 is a buffer component (Buffer-AC) between two links, namely LINK-A and LINK-C.

In one embodiment, an interconnection is coupled between a memory subsystem and a processor and the interconnection includes at least one link upon which a signal is carried. A cooling assembly may be coupled to the interconnection to thermally clamp the interconnection to the second cryogenic temperature domain. There may be a transition region (a third segment) in which the conductor's temperature is changing In the depicted embodiment, as illustrated in the expanded view 220 of a segment of the interconnection 206, the interconnection 206 includes multiple conductors. The conductors can be conductive traces printed on the insulating substrate or wires embedded within the insulating substrate. In some cases, the pair of the conductors forms a link and the interconnection 206 includes multiple links, including links for data signals and links for control signals. In one implementation, the interconnection 206 includes 10 links. For example, the links may carry signals for a packetized protocol that includes memory command, address, data, and/or status information. Alternatively, other arrangements are possible. It should also be noted that the links may be unidirectional links or bi-directional links. The links can operate with various data rates, such as 3-5 Gb/s. Alternatively, other data rates may be used for the links.

As described herein, since the DRAM stacks 201 are located in a first temperature domain 208, such as 77K, and the integrated circuits 209 are located in a second temperature domain 210, such as 4K, the interconnection 206 straddles the two temperature domains with one segment being in the first temperature domain 208 and another segment being in the second temperature domain 210 that is lower than the first temperature domain 208.

In a cryogenic digital system, processing components can be located in a cryogenic temperature like 4K to achieve better energy per operation. In some cases, the processing components in 4K, such as SFQ/JJ circuits, can be used for energy-efficient processing cores (also referred to as 4K processors) that achieve 100 to 1000 times (100-1000×) better energy per operation than processing components in non-cryogenic temperatures. However, there are no 4K circuits available to build large (e.g., 1 TB or larger) memory arrays. Thus, the DRAM stacks 201 can use CMOS DRAM memory components operating in a temperature domain that is close to that of the processing components in 4K. For example, the CMOS DRAM memory components may operate in 77K, which is relatively close in temperature, as compared to CMOS DRAM memory components in non-cryogenic temperatures, such as an ambient temperature. CMOS DRAM memory components of DRAM stacks 201 may need modifications to adjust threshold voltages ($V_T$). The memory buffer components 212 convert signals generated by the integrated circuits 209 of the processing system 204, to CMOS signals. The signals on the interconnection 206 (LINK-A) may have very small voltage swings, such as voltage swings on the order of a few millivolts. Consequently, the closeness in distance and closeness in temperature of the memory buffer components 212 and the integrated circuits 209 (at 4K) are important to keep signal integrity of LINK-A channel as optimal as possible. For example, the memory buffer components 212 may be located in a temperature domain at 77K, where the integrated circuits 209 may be located in a temperature domain at 4K.

Figure 3:
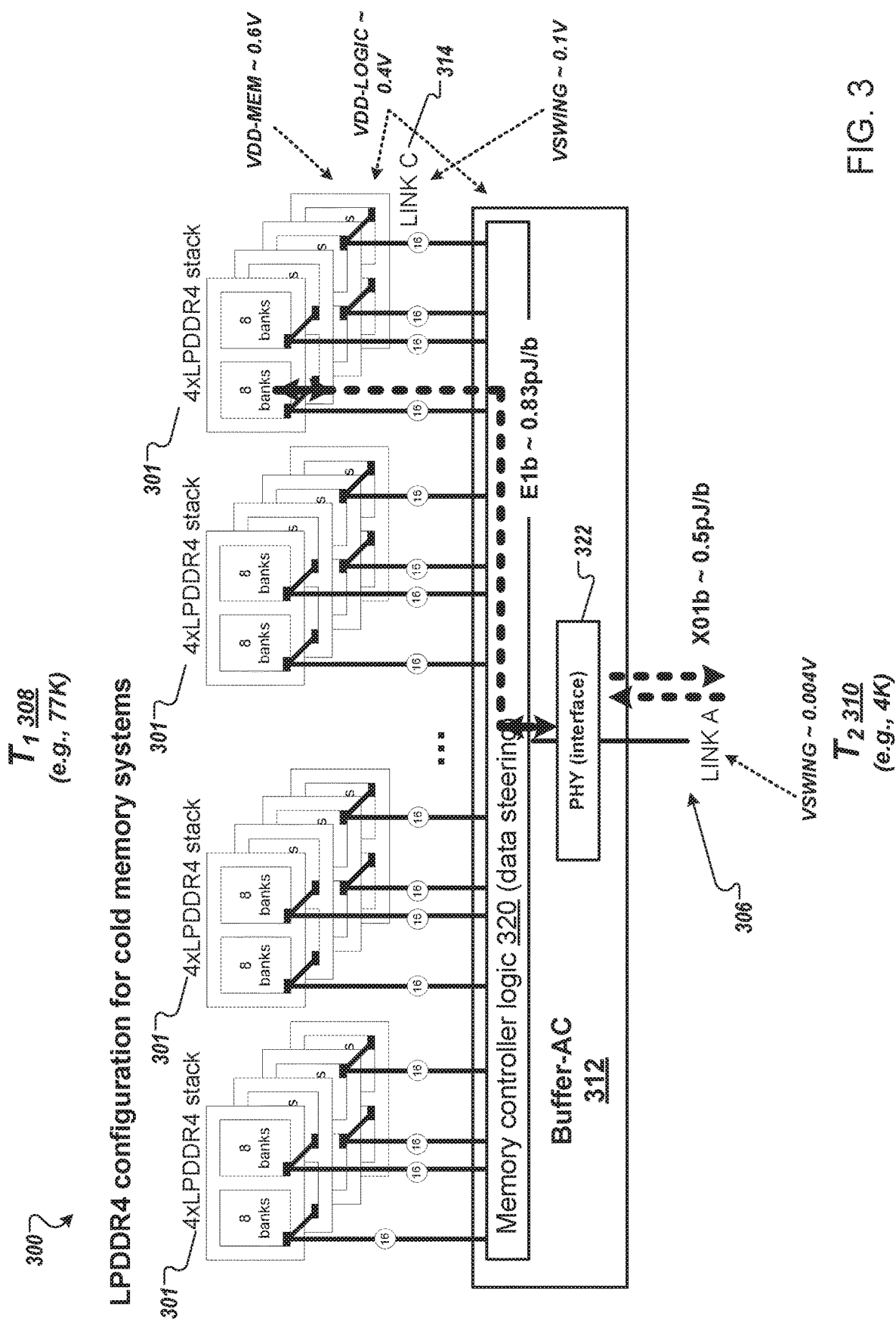
FIG. 3 is a block diagram of a cold memory subsystem with a buffer component and multiple LPDDR4 stacks of memory devices according to one embodiment.

FIG. 3 is a block diagram of a cold memory subsystem 300 with a buffer component 312 and multiple LPDDR4 stacks 301 of memory devices according to one embodiment. The cold memory subsystem 300 is similar to the cold memory subsystem 202 of FIG. 2 in that the multiple LPDDR4 stacks 301 and the buffer component 312 are located in the same temperature domain, namely first temperature domain 308 (e.g., 77K). Each of the multiple LPDDR4 stacks 301 may include four memory devices in the stack and may include two sets of eight banks per memory device. The multiple LPDDR4 stacks 301 are coupled to the buffer component 312. In particular, the multiple LPDDR4 stacks 301 are coupled to memory controller logic 320 (data steering) of the buffer component 312. The memory controller logic 320 can direct data to and from the respective LPDDR4 stacks 301 and the physical interface 322. The physical interface 322 is coupled to the Link A channel 306.

As noted herein, signals from the processing component located in a second temperature domain 310 (e.g., 4K) on Link A channel 306. The signals may have very small voltage swing, such as on the order of a few millivolts (e.g., 4 mV). Thus, the buffer component 312 should be close in distance and temperature to the processing component (e.g., 4K processing logic) to keep signal integrity on Link A channel 306 as optimal as possible. A temperature like 77K for the first temperature domain 308 may allow VDD supply voltages to be lowered, reducing access energy and transport energy of CMOS type memory used for the multiple LPDDR4 stacks 301. For example, the VDD for the memory devices can be approximately 0.6 volts and the VDD for logic at the memory devices and the buffer component 312 can be approximately 0.4 volts. A voltage swing on the Link C channel 314 may be approximately 0.1 volts. In one implementation, the access energy may be approximately 0.83 pJ/b and the transport energy can be approximately 0.5 pJ/b. Alternatively, other values for the access energy and transport energy may be achieved.

Figure 4:
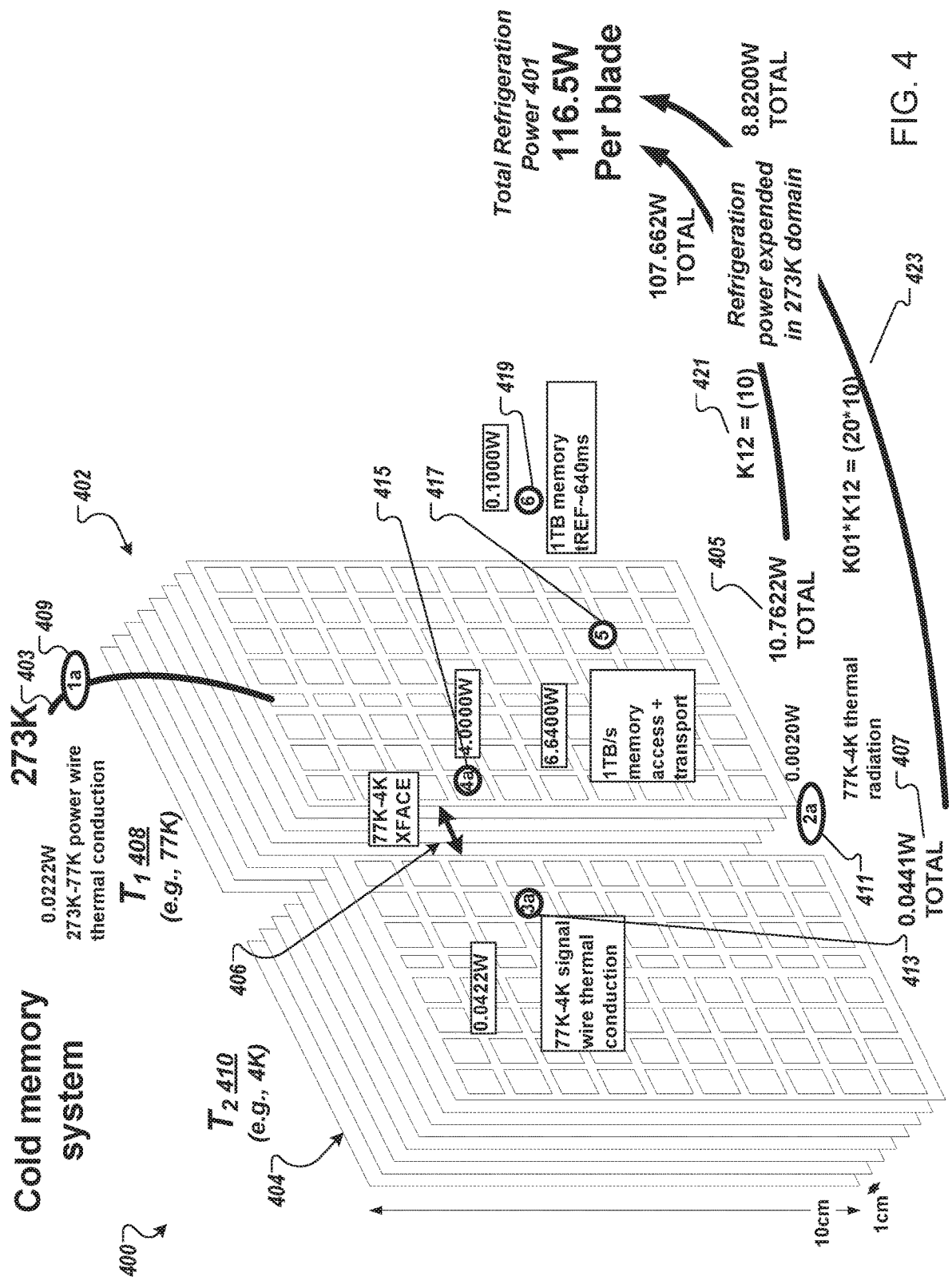
FIG. 4 is a block diagram of a cryogenic digital system with a cold memory subsystem in a first temperature domain and a processing system in a second temperature domain according to one embodiment.

FIG. 4 is a block diagram of a cryogenic digital system 400 with a cold memory subsystem 402 in a first temperature domain 408 and a processing system 404 in a second temperature domain 410 according to one embodiment. The cold memory subsystem 402 may be similar to the cold memory subsystem 302. The cold memory subsystem 402 is coupled to the processing system 404 via an interface 406 including one or more links. The interface 406 is between the first temperature domain 408 and the second temperature domain 410 (77K-4K interface). A power wire 403 can be coupled to the cold memory subsystem.

To determine a total refrigeration power 401 expended in the ambient temperature domain (273K) to cool the cryogenic digital system 400, there are thermodynamic inefficiency and mechanical inefficiency components as described below. The total refrigeration power 401 can also be referred to as cooling efficiency. As noted above, heat can be contributed to the power dissipated by thermal conduction, electrical heating, and power expended to remove the heat from a lower temperature domain. In one implementation, as illustrated in FIG. 4, the first temperature domain 408 can be 77K and the second temperature domain 410 can be 4K. The power wire 403 can also extend from ambient temperature of 273K to 77K to power the cold memory subsystem. As illustrated in FIG. 4, the power dissipated 405 by the cold memory subsystem 402 is approximately 10.8 Watts (W) and the power dissipated 407 by the processing system 404 is approximately 44 mW. In this example, the power wire 403 that goes from 273K to 77K in the first temperature domain 408 can contribute approximately 22 mW to the power dissipated 405 due to thermal conduction 409 between the two temperature domains (e.g., 273K to 77K). There can be approximately 2 mW added to the power dissipated 407 due to thermal conduction 411 between the processing system 404 in the second temperature domain 410 (e.g., 4K) and the cold memory subsystem 402 in the first temperature domain 408 (e.g., 77K). Similarly, due to thermal conduction 413 of the signal wires on the interface 406 between the second temperature domain 410 and the first temperature domain 408, another 42 mW approximately can be added to the power dissipated 407. Due to electrical heat 415 memory components, approximately 4 W is added to the power dissipated 405. Also, approximately 6.6 W can be added to the power dissipated 405 due to electrical heat 417 for memory access and transport in the cold memory subsystem 402. While the cold memory subsystem 402 is performing memory accesses for the cryogenic processing system 404, such as 1 TB/s of bandwidth, the cold memory subsystem 402 can keep the memory contents refreshed with background row access operations. These may be done at the interval of 640 ms (cold) or 256 ms (cool) for every row of every bank of every memory device in the system. This refresh activity generates heat (like the 1 TB/s of read/write accesses), and this heat needs to be removed. For example, another 0.1 W approximately is added to the power dissipated 405 due to electrical heat 419 for the cold memory subsystem 402 to refresh the memory contents. It should be noted that the example and values described herein with respect to FIG. 4 are only intended to show the relative importance of the different power contributors and that, in any given embodiment, can vary significantly.

When the power dissipated 405 by the cold memory subsystem 402 in the 77K domain is 10.8 W, a refrigeration unit in the 273K domain uses approximately 96.9 W to re-cool the coolant fluid. A cooling parameter 421 (K12) is approximately 10 and includes thermodynamic inefficiency and mechanical inefficiency components, resulting in approximately 107.662 W of refrigeration power in the 273K domain to cool the cold memory subsystem 402 in the first temperature domain 408. That is, for every 10 W in the first temperature domain 408, 100 W is needed at the ambient temperature (e.g., 298K) to cool the first temperature domain 408. Also, a cooling parameter 423 (K01*K12= (20*10)) is approximately 200 and includes thermodynamic inefficiency and mechanical inefficiency components, resulting in approximately 8.8200 W of refrigeration power in the 273K domain to cool the processing system 404 in the second temperature domain 410. The total refrigeration power 401 in the 273K domain is 116.5 W per blade to cool the cryogenic digital system 400. As illustrated, the cryogenic digital system 400 includes eight blades of memory components in the first temperature domain, memory buffer components in the second temperature domain, and processing components in the third temperature domain. In other embodiments, the cryogenic digital system 400 may include more or less blades than eight.

Figure 5:
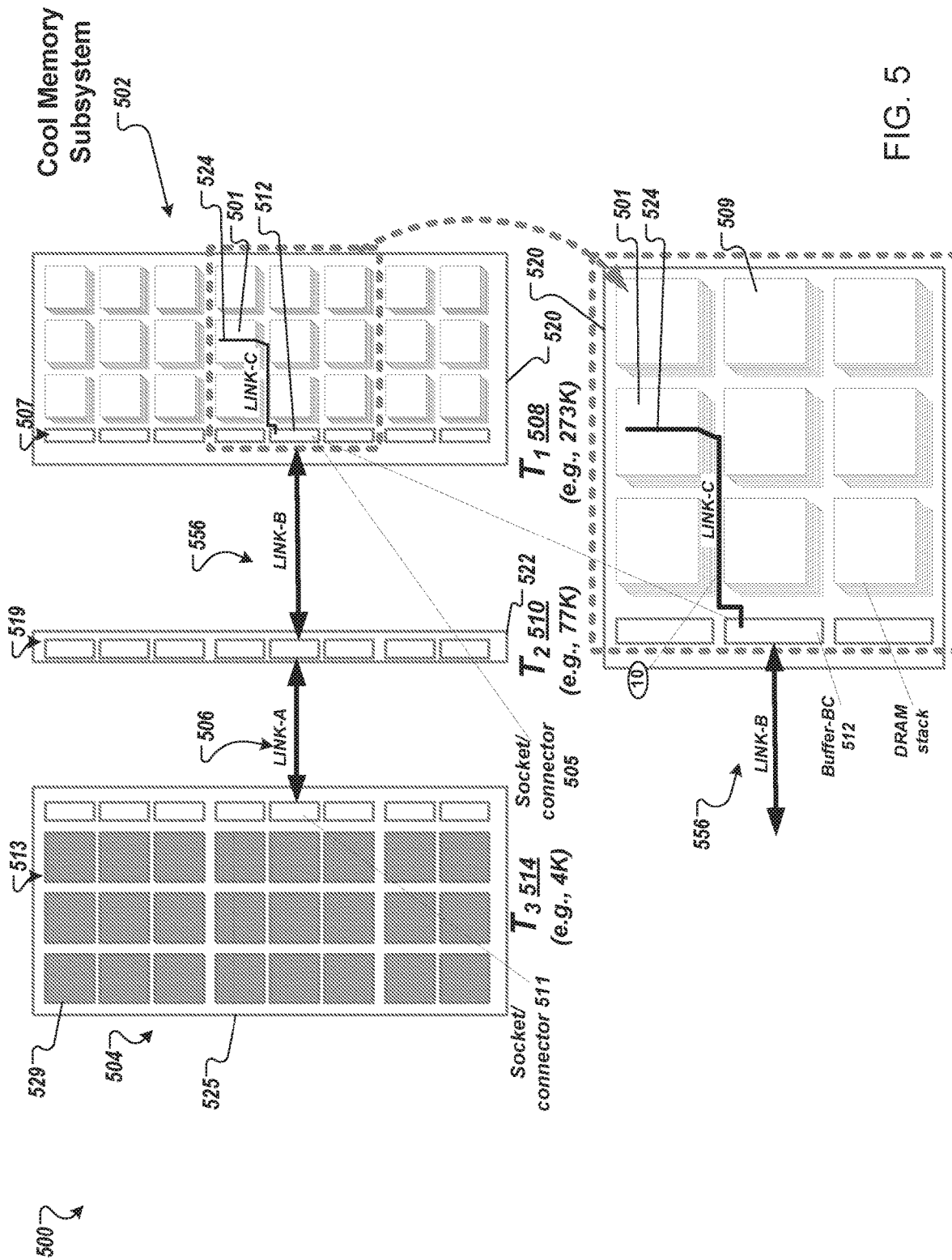
FIG. 5 is a block diagram of a cryogenic digital system with a cool memory subsystem having memory components in a first temperature domain and memory buffer components in a second temperature domain and a processing system in a third temperature domain according to one embodiment.

FIG. 5 is a block diagram of a cryogenic digital system 500 with a cool memory subsystem 502 having memory components 501 in a first temperature domain and memory buffer components 503 in a second temperature domain and a processing components 529 of a processing system 504 in a third temperature domain according to one embodiment. The term "cool" is used herein to designated memory systems that are run at temperatures close to, but below ambient temperature (300K), which requires some refrigeration overhead, whereas the term "warm" is used to designated memory systems that are run with forced (ambient) air (fans, not refrigerators, −300K and above). The "cool" can refer to 273K (water freezing), of 298K (room temperature) or even 358K (upper end of commercial range −85 C). The term "cold" is used herein to designate memory systems that are cryogenic temperatures or temperatures that are not cryogenic, but still cooler than "cool" memory subsystems. It should be noted that the cryogenic digital system 500 may include cryogenic, cold, and cool temperature domains for the three temperature domains. Having a mix of components that operate in three non-overlapping temperature bands can help optimize the digital system as described herein.

The memory components 501 of the cool memory subsystem 502 may be multiple DRAM stacks 501 disposed on a front surface of a substrate 520. The DRAM stacks 501 are coupled to a connector 505 (e.g., socket connector) in an interface region 507 on the front surface of the substrate 520. The DRAM stacks 501 may be 4xLPDDR4 stacks. Alternatively, other memory components may be used at the respective device sites and the memory component may be a single memory component at the respective device site, a die-stacked memory component, a package-stacked memory component, or the like. Unlike the cryogenic digital system 400, the cryogenic digital system 500 includes a first set of memory buffer components 512 in the first temperature domain 508 and a second set of memory buffer components 503 in the second temperature domain 510. The first set of memory buffer components 512 are disposed on a front surface of the substrate 520 and the second set of memory buffer components 503 are disposed on a front surface of a substrate 522. The memory second set of memory buffer components 503 are coupled to a connector 517 (e.g., socket connector) in an interface region 519 on the front surface of the substrate 522.

The processing system 504 includes one or more integrated circuits 529, such as processors, processor cores, SoCs, or the like. The integrated circuits 529 are coupled to a connector 511 (e.g., socket connector) in an interface region 513 on a front surface of a substrate 525 of the processing system 504. A first interconnection 506 is coupled between the connector 511 and the connector 517. The first interconnection 506 is labeled LINK-A in FIG. 5. The first interconnection 506 (LINK-A) is coupled to a memory buffer component 503 via the connector 517. A second interconnection 556 is coupled between the connector 517 and the connector 505. The second interconnection 556 is labeled LINK-B in FIG. 5. The second interconnection 556 (LINK-B) is coupled to a memory buffer component 512 via the connector 505. It should be noted that only two interconnections 506, 556 are illustrated in FIG. 5, but there may be two interconnections 506, 556 for each memory buffer components 503, 512. In some embodiments, the first and second interconnections 506, 556 can include socketed attachment to the respective circuit boards. Alternatively, other arrangements of interconnections may be possible, such as directly bonded attachments or the like. The memory buffer component 512 is coupled to interconnections to the DRAM stacks 501, such as illustrated by link 524 between the memory buffer component 512 and one of the DRAM stacks 501; the link 524 is labeled as LINK-C. The memory buffer component 503 is a buffer component (Buffer-AB) between two links, namely LINK-A and LINK-B. The memory buffer component 512 is a buffer component (Buffer-BC) between two links, namely LINK-B and LINK-C. In one embodiment, an interconnection is coupled between a memory subsystem and a processor and the interconnection includes at least one link upon which a signal is carried. The interconnection may include an insulating substrate and the at least one link includes a first conductive trace disposed on the insulating substrate and a second conductive trace disposed on the insulating substrate. The two conductive traces can form a link. Alternatively, the interconnection may include a pair of conductors to form a single link. A cooling assembly may be coupled to the interconnection to thermally clamp the interconnection to the second cryogenic temperature domain. There may be a transition region (a third segment) in which the conductor's temperature is changing.

In the depicted embodiment, as illustrated in the expanded view 522 of a segment of the first interconnection 506 and a segment of the second interconnection 556, the second interconnection 556 includes multiple conductors 521 disposed on an insulating substrate 523. The conductors 521 can be conductive traces printed on the insulating substrate 523 or wires embedded within the insulating substrate 523. In some cases, the a pair of the conductors 521 forms a link and the interconnection 556 includes multiple links, including links for data signals and links for control signals. In one implementation, the second interconnection 556 includes 10 links. For example, the links may carry write data and control/command/address information, read data and status information, or both. Alternatively, other arrangements are possible. It should also be noted that the links may be unidirectional links or bi-directional links. The links can operate with various data rates (e.g., 3-5 Gb/s). Alternatively, other data rates may be used for the links.

As described herein, since the DRAM stacks 501 are located in a first temperature domain 508 (e.g., 273K), the memory buffer components 503 are located in a second temperature domain 510 (e.g., 77K), and the integrated circuits 529 are located in a third temperature domain 514 (e.g., 4K), the second interconnection 556 straddles the two temperature domains with one segment being in the first temperature domain 508 and another segment being in the second temperature domain 510 that is lower than the first temperature domain 508 and the first interconnection 506 straddles the two temperature domains with one segment being in the second temperature domain 510 and another segment being in the third temperature domain 514 that is lower than the second temperature domain 510.

As described above, in a cryogenic digital system, processing components can be located in a cryogenic temperature like 4K to achieve better energy per operation. In some cases, the processing components in 4K, such as SFQ/JJ circuits, can be used for energy-efficient processing cores (also referred to as 4K processors) that achieve 100 to 1000 times (100-1000×) better energy per operation than processing components in non-cryogenic temperatures. In the cryogenic digital system 500 in FIG. 5, standard CMOS DRAM memory components can be used for the memory components 501 since the first temperature domain 508 is close to room temperatures (e.g., 298K). The first temperature domain 508 may correspond to a normal commercial operating temperature range of the DRAM component. As an example, server memory is specified to a commercial temperature grade from 0° C. to 85° C. and is often operated in an air cooled environment with a well-controlled temperature around 50° C., while memory for more rugged applications is specified to an industrial temperature grade from −40° C. to 95° C. and its actual operating temperature can fall anywhere in this range. Also, in the cryogenic digital system 500 in FIG. 5, standard storage-class memory (SCM) components can be used, as the first temperature domain 508 is close to room temperatures. The CMOS DRAM memory components (or SCM components) of DRAM stacks 501 may not need modifications to adjust threshold voltages ($V_T$). Thus, standard, unmodified CMOS DRAM components may be used in this design. The signals on the interconnection 506 (LINK-A) may have very small voltage swings, such as voltage swings in the order of a few millivolts. Consequently, the signal integrity of LINK-A channel may still be optimal for receiving low-voltage swing signals.

The cryogenic digital system 500 may use a first buffer component in the first temperature domain, in addition to a second buffer component in the second temperature domain. The cryogenic digital system 500 may use a first link between the first temperature domain and the second temperature domain and a second link between the second temperature domain and the third temperature domain. The cryogenic digital system 500 may utilize higher VDD supply voltages at 273K (relative to 77K) and may have a higher energy per bit for transport and access at 273K (relative to 77K). Since the second memory buffer components are disposed on a separate substrate than the substrate on which the memory components are disposed, the cryogenic digital system 500 may use more physical volume to accommodate the third temperature domain. However, as described herein, the increased physical volume may be offset from other advantages of having three temperature domains, as described herein. For example, the second temperature domain may operate as a thermal radiation shield between the first and third temperature domains. Also, the cryogenic digital system 500 may still have optimal signal integrity of LINK-A channel for receiving low-voltage swing signals. The cryogenic digital system 500 allows standard, unmodified CMOS DRAMs to be used (no $V_T$ shift). The first temperature domain of 273K, for example, being warmer than 77K, allows operation of the cryogenic digital system 500 to keep refresh power at about 4% of peak memory power, which is lower than servers. Also, the cryogenic digital system 500 may allow lower energy per bit (for 1 TB/s) because most power is expended at the first temperature domain of 273K (and less power will be required to move the heat energy to the ambient temperature domain).

Figure 6:
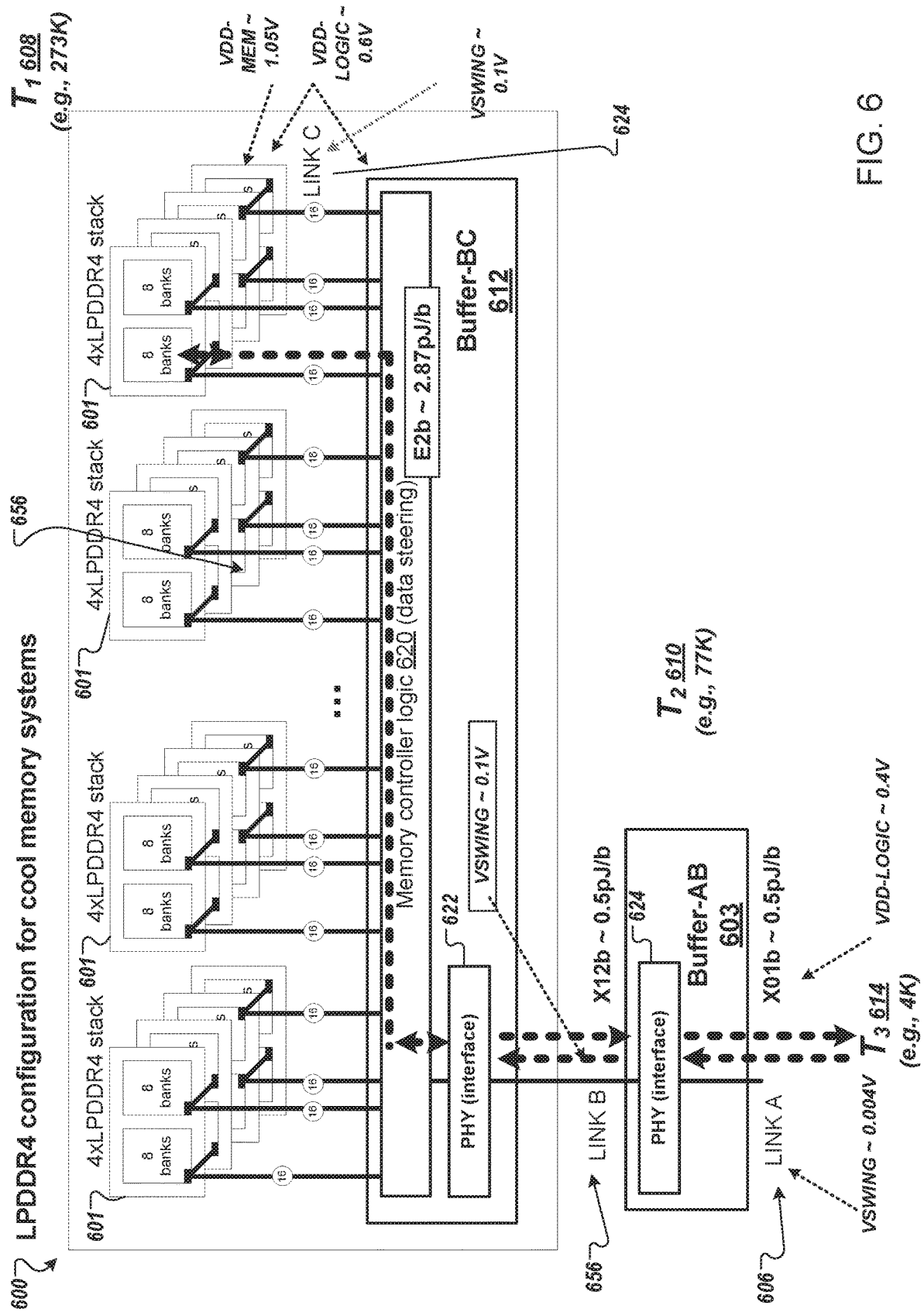
FIG. 6 is a block diagram of a cool memory subsystem with a first buffer component and multiple LPDDR4 stacks of memory devices in a first temperature domain and a second buffer component in a second temperature domain according to one embodiment.

FIG. 6 is a block diagram of a cool memory subsystem 600 with a first buffer component 612 and multiple LPDDR4 stacks 601 of memory devices in a first temperature domain 608 and a second buffer component 603 in a second temperature domain 610 according to one embodiment. The cool memory subsystem 600 is similar to the cool memory subsystem 502 of FIG. 5 in that the multiple LPDDR4 stacks 601 of memory devices and the first buffer component 612 are located in the same temperature domain, namely first temperature domain 608 (e.g., 77K). Each of the multiple LPDDR4 stacks 601 may include four memory devices in the stack and may include two sets of eight banks per memory device. The multiple LPDDR4 stacks 601 are coupled to the first buffer component 612. In particular, the multiple LPDDR4 stacks 601 are coupled to memory controller logic 620 (data steering) of the first buffer component 612. The memory controller logic 620 can direct data to and from the respective LPDDR4 stacks 601 and the physical interface 622. The physical interface 622 is coupled to a Link B channel 656. The Link B channel 656 is coupled to the second buffer component 603 located in the second temperature domain 610. The second buffer component 603 includes a physical interface 624 that is coupled between the Link B channel 656 and Link A channel 606 to route data. The second buffer component 603 may also include some logic that, at a minimum, can amplify the signals on Link A channel 606 and redrive the amplified signals on the Link B channel 656. The second buffer component 603 can also sample (retime) the signals on the Link A channel 606 with a timing signal (e.g., clock signal) and may also change a serialization ratio. The second buffer component 603 may also do some data steering if it is handling multiple channels, such as multiple Link A channels and multiple Link B channels. In another embodiment, there may be data steering in multiple places, such as long range data steering in the 4K domain and, since a single element of Link A may bundle the data from a number of DRAM stacks, there may also be local data steering in the warmer domains between the DRAM stacks that are bundled to one Link A channel, as illustrated in FIG. 1. Alternatively, as illustrated in FIG. 6, the data steering can be done in the first temperature domain 608 (e.g., 273K domain). Since there may be no inherent advantage of doing it at the second temperature domain 610 (e.g., 77K domain), data steering in the first temperature domain 608 may save cooling overhead. In other embodiments, the data steering could be done in the second temperature domain 610 (e.g., 77K domain) or in a hybrid setup with some data steering in the first temperature domain 608 (e.g., 273K domain) and some data steering in the second temperature domain 610 (e.g., 77K domain).

As noted herein, signals from the processing component located in a third temperature domain 614 (e.g., 4K) on Link A channel 606. The signals may have very small voltage swing, such as on the order of a few millivolts (e.g., 4 mV). Thus, the second buffer component 602 should be close in distance and temperature to the processing component (e.g., 4K processing logic) to keep signal integrity on Link A channel 606 as optimal as possible. A temperature like 77K for the second temperature domain 610 may allow VDD supply voltages to be lowered in the second temperature domain 610 and the first temperature domain 608, reducing access energy and transport energy of CMOS type memory used for the multiple LPDDR4 stacks 601. For example, the VDD for the second buffer component 603 can be approximately 0.4 volts (V), the VDD for the memory devices can be approximately 1.05 V and the VDD for logic at the memory devices and the first buffer component 612 can be approximately 0.6 V. A voltage swing on the Link C channel 624 may be approximately 0.1 volts. In one implementation, the access energy may be approximately 2.87 pJ/b and the transport energy can be approximately 0.5 pJ/b on Link B channel 656 and 0.5 pJ/b on Link C channel 606. Alternatively, other values for the access energy and transport energy may be achieved. It should be noted that the VDD supply voltages at the first temperature domain 608 of 273K relative to VDD supply voltages at 77K (in FIG. 3) are higher. Also, there may be higher energy per bit for the transport and access of the memory devices at the first temperature domain 608 of 273K relative to the transport and access of the memory devices at the first temperature domain 308 of 77K in FIG. 3. However, as shown in FIG. 7, a total refrigeration power to cool the cryogenic digital system is less when the memory components are located in the first temperature domain 608 and the memory buffer components are located in the second temperature domain 610 than when the memory components and the memory buffer components are both located in a cooler temperature domain, such as 77K.

Figure 7:
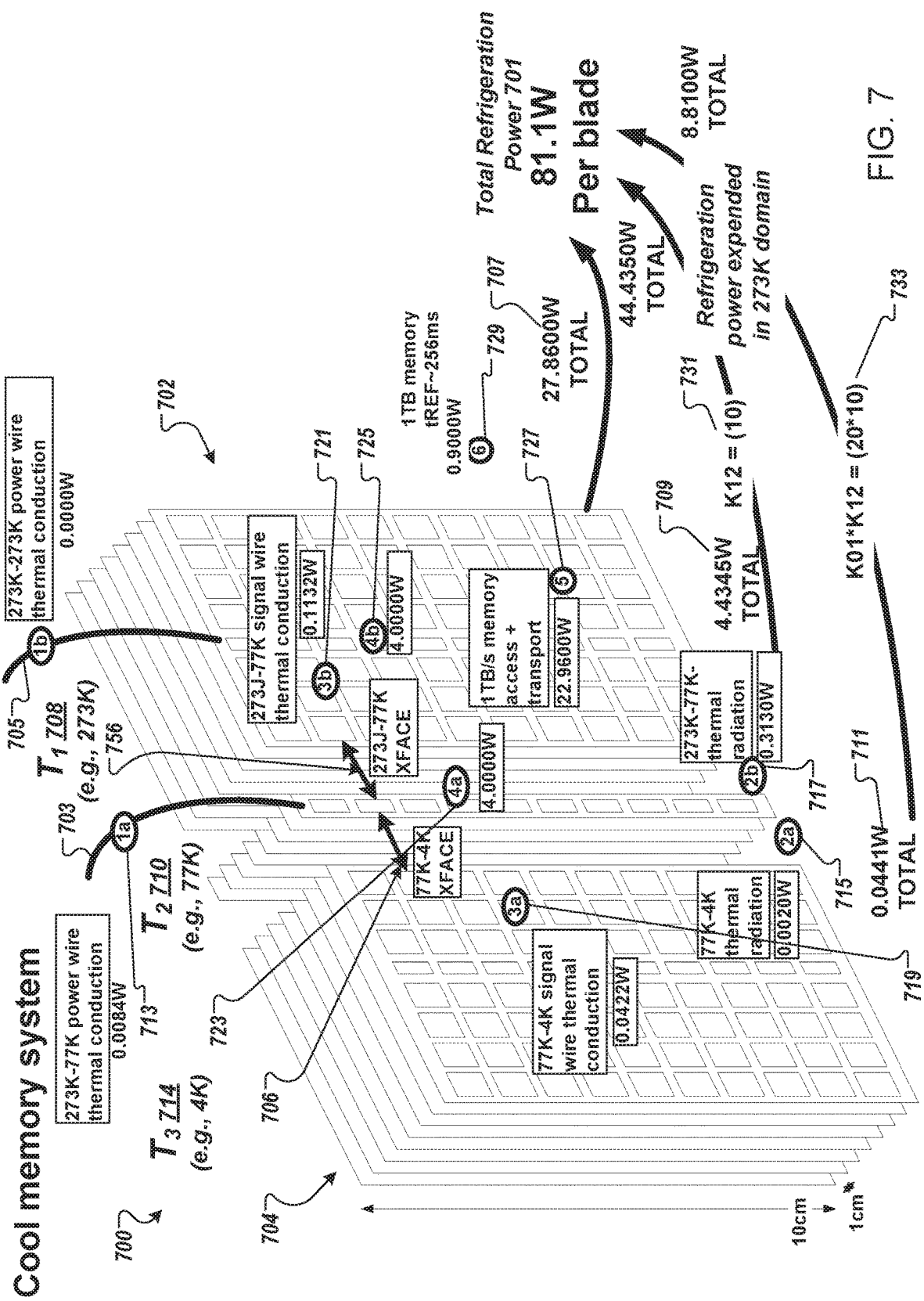
FIG. 7 is a block diagram of a cryogenic digital system with a cool memory subsystem with memory components in a first temperature domain and buffer components in a second temperature domain and a processing components of a processing system in a third temperature domain according to one embodiment.

FIG. 7 is a block diagram of a cryogenic digital system 700 with a cool memory subsystem 702 with memory components in a first temperature domain and buffer components in a second temperature domain 710 and a processing components of a processing system 704 in a third temperature domain 714 according to one embodiment. The cool memory subsystem 702 may be similar to the cool memory subsystem 502. The cool memory subsystem 702 includes memory components 709 coupled to memory buffer components via a first interface 756 including one or more links, such as links on an interconnection (Link B channel). The memory buffer components are coupled to the processing system 704 via a second interface 706 including one or more links, such as links on an interconnection (Link A channel). The first interface 756 is between the first temperature domain 708 and the second temperature domain 710 (273K-77K interface) and the second interface 706 is between the second temperature domain 710 and the third temperature domain 714 (77K-4K interface). A first power wire 703 can be coupled to the buffer components in the cool memory subsystem 702 in the second temperature domain 710 and a second power wire 705 can be coupled to the memory components of the cool memory subsystem 702 in the first temperature domain 708.

To determine a total refrigeration power 701 expended in the ambient temperature domain (298K) to cool the cryogenic digital system 700, there are thermodynamic inefficiency and mechanical inefficiency components as described below. As noted above, heat can be contributed to the power dissipated by thermal conduction, electrical heating, and power expended to remove the heat from a lower temperature domain. In one implementation, as illustrated in FIG. 7, the first temperature domain 708 can be 273K, the second temperature domain 710 can be 77K and the third temperature domain 714 can be 4K. The first power wire 703 can also extend from first temperature domain 708 (273K or ambient temperature at 298K to 77K) to power the buffer components of the cool memory subsystem 702. As illustrated in FIG. 7, the power dissipated 707 by the cool memory subsystem 702 in the first temperature domain 708 is approximately 27.9 W, the power dissipated 709 by the cool memory subsystem 702 (i.e., the buffer components) in the second temperature domain 710 is approximately 4.4 W, and the power dissipated 711 by the processing system 704 is approximately 44 mW. In this example, the first power wire 703 that goes from 273K to 77K in the second temperature domain 710 can contribute approximately 8 mW to the power dissipated 709 due to thermal conduction 713 between the two temperature domains (e.g., 273K to 77K). The second power wire 705 may not contribute any power due to thermal conduction since the second power wire is in the same temperature domain as the memory components. There can be approximately 2 mW added to the power dissipated 711 due to thermal conduction 715 between the processing system 704 in the third temperature domain 714 (e.g., 4K) and the buffer components in the second temperature domain 710 (e.g., 77K). There can be approximately 0.3 W added to the power dissipated 709 due to thermal conduction 717 between the buffer components in the second temperature domain 710 (e.g., 77K) and the memory components in the first temperature domain 708 (e.g., 273K). Similarly, due to thermal conduction 719 of the signal wires on the interface 706 (Link A) between the third temperature domain 714 and the second temperature domain 710, another 42 mW approximately can be added to the power dissipated 711. Due to thermal conduction 721 of the signal wires on the interface 756 (Link B) between the second temperature domain 710 and the first temperature domain 708, another 0.1132 W approximately can be added to the power dissipated 707. Due to electrical heat 723 of the buffer components in the second temperature domain 710, approximately 4 W is added to the power dissipated 709. Due to electrical heat 726 of the memory components in the first temperature domain 708, approximately 4 W is added to the power dissipated 707. Also, approximately 23 W can be added to the power dissipated 707 due to electrical heat 727 for memory access and transport in the cool memory subsystem 702 in the first temperature domain 708. Another 0.9 W approximately is added to the power dissipated 707 due to electrical heat 729 for the cool memory subsystem 702 to refresh the memory contents as described herein. It should be noted that the power required to refresh the DRAM devices can be higher because of the increased value of VDD as compared to FIG. 4.

When the power dissipated 709 by the buffer components of the cool memory subsystem 702 in the 77K domain is 4.4345 W, a refrigeration unit in the 273K domain uses approximately 40 W to re-cool the coolant fluid. A cooling parameter 731 (K12) is approximately 10 and includes thermodynamic inefficiency and mechanical inefficiency components, resulting in approximately 44 W of refrigeration power in the 273K domain to cool the cool memory subsystem 702 in the first temperature domain 708. Also, a cooling parameter 733 (K01*K12=(20*10)) is approximately 200 and includes thermodynamic inefficiency and mechanical inefficiency components, resulting in approximately 8.8 W of refrigeration power in the 273K domain to cool the processing system 704 in the third temperature domain 714. The total refrigeration power 701 in the 273K domain is 81.1 W per blade to cool the cryogenic digital system 700 (e.g., a blade server computing system), as compared to 116.5 W to cool the cryogenic digital system 400. As illustrated, the cryogenic digital system 700 includes eight blades of memory components in the first temperature domain, memory buffer components in the second temperature domain, and processing components in the third temperature domain. In other embodiments, the cryogenic digital system 700 may include more or less blades than eight.

Figure 8:
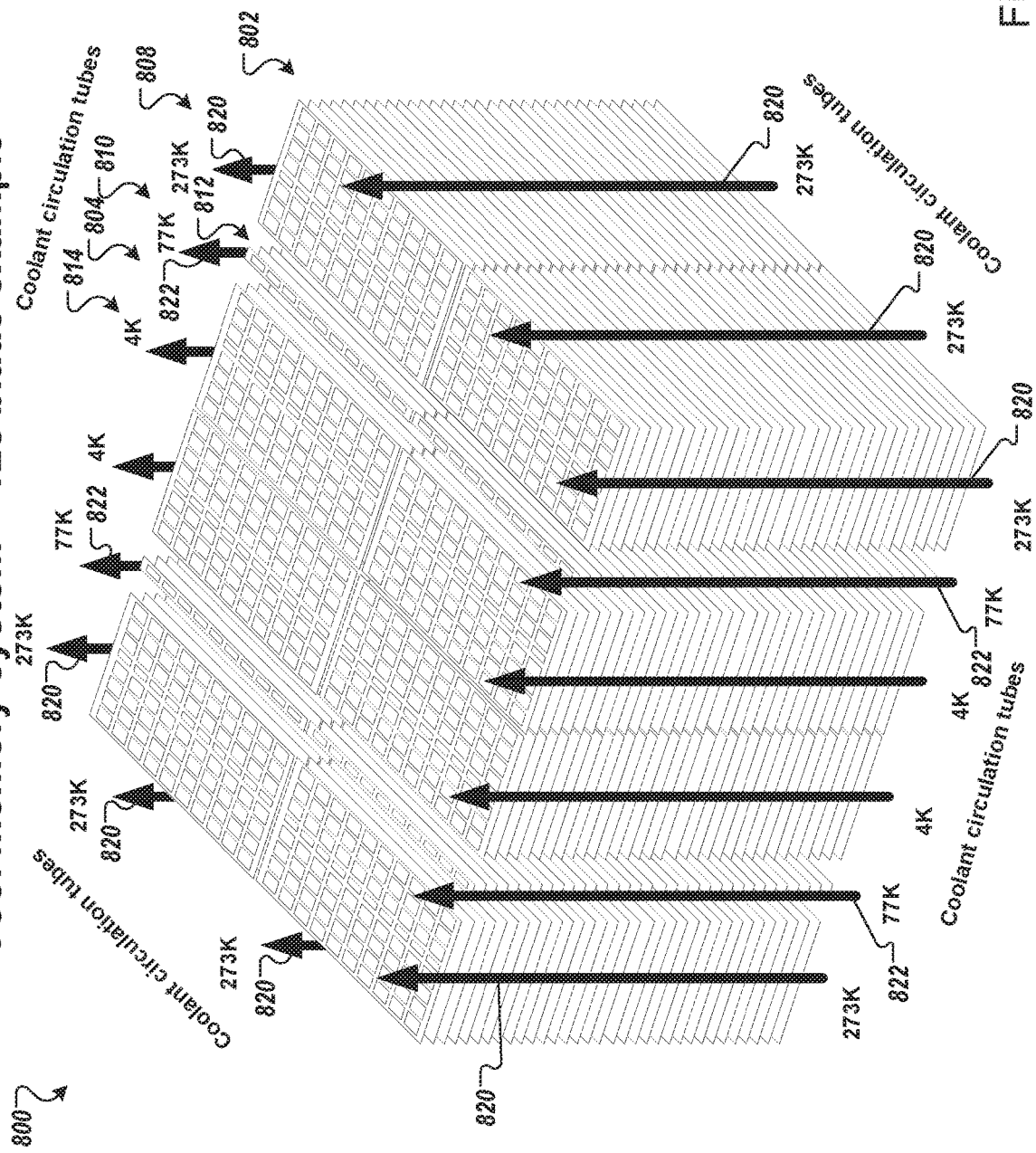
FIG. 8 is a block diagram of a coolant circulation tubes and cryogenic digital system with a cool memory subsystem with memory components in a first temperature domain and buffer components in a second temperature domain and a processing system in a third temperature domain according to another embodiment.

FIG. 8 is a block diagram of a coolant circulation tubes and cryogenic digital system 800 with a cool memory subsystem 802 with memory components 809 in a first temperature domain 808 and buffer components 803 in a second temperature domain 810 and a processing system 804 in a third temperature domain 814 according to another embodiment. A first set 820 of coolant circulation tubes can be disposed near or within the first temperature domain 808. The first set 820 can have a first coolant to cool the first temperature domain 808 to 273K. A second set 822 of coolant circulation tubes can be disposed near or within the second temperature domain 810. The second set 822 can have a second coolant to cool the second temperature domain 810 to 77K. A third set 824 of coolant circulation tubes can be disposed near or within the third temperature domain 814. The third set 824 can have a third coolant to cool the third temperature domain 814 to 4K. In other embodiments, other cooling mechanism may be used for the first temperature domain 808, since the first temperature domain 808 may be an ambient temperature domain.

In the depicted embodiment, the cryogenic digital system 800 includes 128 blades with each blade having a cool memory subsystem 802 with memory components 809 in the first temperature domain 808 and buffer components 803 in the second temperature domain 810 and a processing system 804 in the third temperature domain 814.

For example, in each plane of the stack-up of the cryogenic digital system 800 there are four sets of the one blade described with respect to the FIG. 7. That is, there are four blades on a first plane and there are four blades on each of the other 31 planes of the stack-up. The four blades are arranged such that the four processing systems 804 are arranged in in a center of the stack-up with each of the four processing systems 804 in four quadrants. These four processing system 804 can be located in a single temperature domain, third temperature domain 814. The second temperature domain 810 can be disposed on two opposite sides of the single temperature and the buffer components 803 for two of the blades are on a first side in one of the two second temperature domains 810 and the buffer components for the other two blades are on a second side, opposite to the first side, in the other one of the two second temperature domains 810. Similarly, the first temperature domain 808 can be disposed on two opposite sides of the two second temperature domains 810 and the memory components 809 for two of the blades are on a first side in one of the two first temperature domains 808 and the memory components 809 for the other two blades are on a second side, opposite to the first side, in the other one of the two first temperature domains 808. In effect, the two second temperature domains 810 (e.g., 77K) can shield the third temperature domain 814 (e.g., 4K) from thermal radiation of the first temperature domain (e.g., 273K). The stack-up can provide room for coolant circulation on all sides of the blade, as well as extra room for extra power dissipation of the first temperature domain 808 (e.g., 273K). In one embodiment, the first temperature domain 808 is 273K, which matches approximately the temperature of sea water from moderate depth (e.g., 100-200 meters). For example, a heat exchanger can be used to pump sea water into the coolant system to cool the first temperature domain 808.

Figure 9:
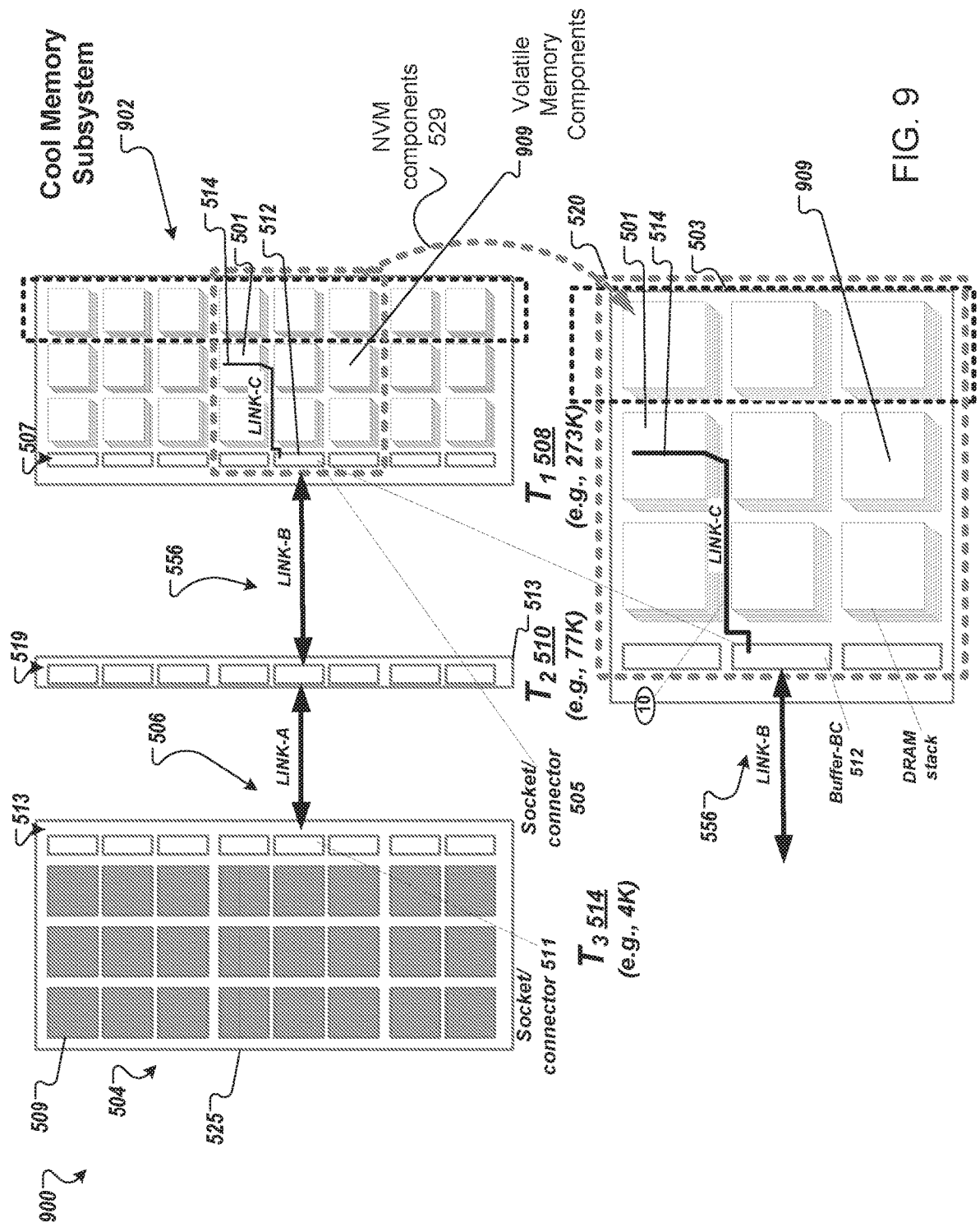
FIG. 9 is a block diagram of a cryogenic digital system with a cool memory subsystem having volatile memory components and non-volatile memory components in a first temperature domain and memory buffer components in a second temperature domain and a processing system in a third temperature domain according to one embodiment.

FIG. 9 is a block diagram of a cryogenic digital system 900 with a cool memory subsystem 902 having volatile memory components and non-volatile memory components in a first temperature domain and memory buffer components 503 in a second temperature domain and a processing system in a third temperature domain according to one embodiment. The cryogenic digital system 900 is similar to the cryogenic digital system 500 as noted with similar reference numbers. The cool memory subsystem 902 of the cryogenic digital system 900 includes volatile memory components 909 and non-volatile memory (NVM) components 929. The cool memory subsystem 902 can use the NVM components 929 to provide for memory persistence, such as to preserve state of processes during power disruption events. The NVM components 929 can any type of NVM, such as standard SCM components, such as flash devices, phase-changed memory (PCM), resistive random-access memory (RRAM or ReRAM). The SCM components may also be volatile memory and other mechanisms can be used to preserve the state for a limited time before loss of power to the volatile memory.

In one embodiment, in response to a power failure of the computer system, the contents of at least one of the volatile memory components 909 (e.g., DRAM components) are transferred to at least one of the NVM components 929 (e.g., flash NVM component).

It may be difficult for the cold memory subsystem configurations described herein (e.g., 202, 302, 402) to include NVM components because a path to NVM components would be through the 4K domain. The cool memory subsystem configurations described herein (e.g., 502, 602, 702, 802, and 902) may include NVM components as these configurations can accommodate local standard NVM components for storage (e.g., flash memory components) with uninterruptible power supply (e.g., from battery or the like) to allow the volatile memory components (e.g., DRAM devices) to transfer contents to the NVM components, such as illustrated in the cool memory subsystem 902 with volatile memory components 909 and NVM components 929. There may be less NVM components 929 than the volatile memory components 909 as the NVM components 929 may have a higher capacity than the volatile memory components 909. In some embodiments, the buffer components (or memory controller) can automatically read data from the volatile memory components 909 and write the data to the NVM components 929 upon a power failure event.

In one embodiment, an electronic system includes a memory subsystem in a first cryogenic temperature domain and a processor in a second cryogenic temperature domain that is lower in temperature than the first cryogenic temperature domain. In another embodiment, a computer system has three temperature domains with memory components (any memory circuits) in a first temperature domain (e.g., 273K), memory buffer components (any buffer logic circuits) in a second temperature domain (e.g., 77K) that is lower in temperature than the first temperature domain, and execution logic circuits (any processing component, device, or system) in a third temperature domain (e.g., 4K) that is lower in temperature than the second temperature domain. It should be noted that the execution logic circuits in the third temperature domain may include execution logic, as well as a copy of a subset (e.g., cache) of main physical memory in the first temperature domain. That is the physical address space is in the first temperature domain, but a copy of a subset of the physical address space may be in the third temperature domain at a given point in time. The execution logic circuits may reside on a processor integrated circuit.

The three temperature domains can be set so that, during normal operation, the temperature ranges of the three temperature domains do not overlap. In one embodiment, the third temperature domain has a cryogenic temperature range having an upper temperature limit set by an upper temperature limit of the execution logic circuits. In another embodiment, the third temperature domain has a cold temperature range having a lower temperature limit set by a cooling efficiency of the entire computer system or a cooling efficiency of a portion of the computer system. In some cases there may be two or three cooling loops with their own coolant and heat exchangers with separate efficiency metrics. In general, a system design should try to limit the amount of interaction the temperature domains will have; i.e., limit the thermal radiation and thermal conduction between them, and try to maximize the amount of heat that is removed by each cooling loop. In another embodiment, the second temperature domain has a cold temperature range having an upper temperature limit set by a receiver of the memory buffer components. This receiver may be a Link A channel receiver.

In another embodiment, the first temperature domain has a cool temperature range having a lower temperature limit set by a cooling efficiency. The first temperature domain may have a cool temperature range having a lower temperature limit set by an operating temperature range of the memory components. In another embodiment, the memory components include a DRAM device and the first temperature domain has a cool temperature range having a lower temperature limit set by an operating temperature range of the DRAM device. In another embodiment, the first temperature domain has a cool temperature range having an upper temperature limit set by a retention time of the memory components, such as the retention time of the DRAM device. The DRAM device may be a standard DRAM device and the first temperature domain may correspond to a normal commercial operating temperature range of the DRAM device. In another embodiment, the first temperature domain has a cool temperature range having a lower temperature limit set by an ambient temperature.

In another embodiment, a coolant fluid circulation system to transfer heat generated by the memory components in the first temperature domain to a fluid medium. The fluid medium may be sea water pumped from a moderate depth, such as 100-200 meters or even deeper.

In another embodiment, the computer system includes: 1) a first coolant fluid circulation system set at approximately a lower temperature limit of the first temperature domain; 2) a second coolant fluid circulation system set at approximately a lower temperature limit of the second temperature domain; and 3) a third coolant fluid circulation system set at approximately a lower temperature limit of the third temperature domain. In another the computer system includes: 1) a first heat exchanger to transfer heat generated by the memory components in the first temperature domain to a first medium; 2) a second heat exchanger to transfer heat generated by the memory buffer components in the second temperature domain to a second medium; and 3) a third heat exchanger to transfer heat generated by the execution logic circuits in the third temperature domain to a third medium.

In a further embodiment, the memory buffer components are interposed between the memory components in the first temperature domain and the execution logic circuits in the third temperature domain, the second temperature domain serving as a thermal radiation shield for the third temperature domain from thermal conduction from the first temperature domain.

In another embodiment, a computer system includes 1) memory circuits in a first temperature domain; 2) buffer logic circuits in a second temperature domain that is lower in temperature than the first temperature domain; and 3) execution logic circuits in a third temperature domain that is lower in temperature than the second temperature domain. The memory circuits may include at least one standard SCM component and the first temperature domain corresponds to a normal commercial operating temperature range of the at least one SCM component. The SCM component may include flash NVM, PCM, RRAM or ReRAM, or the like. The SCM component may even include volatile memory, non-volatile memory, or both. In one embodiment, the memory circuits in the first temperature domain include at least one DRAM component and at least one flash NVM component. Upon power failure of the computer system, the contents of the at least one DRAM component are transferred to the at least one flash NVM component automatically.

In another embodiment, an electronic system includes: 1) a first component in a first temperature domain, the first temperature domain being a non-cryogenic temperature domain; 2) a second component in a second temperature domain that is lower in temperature than the first temperature domain; and 3) a third component in a third temperature domain that is lower in temperature than the second temperature domain, the third temperature being a cryogenic temperature domain.

In one embodiment, the first component is a memory component, the second component is a memory buffer component, and the third component is a controller component. In another embodiment, the first component is a memory component, the second component is a memory buffer component, and the third component is a processor. The processor may part of a cryogenic computer and the memory component and memory buffer component are part of a memory subsystem. In one embodiment, the memory subsystem includes multiple DRAM devices disposed on a substrate. In another embodiment, the memory subsystem includes multiple DRAM devices disposed on a substrate and at least one flash NVM device disposed on the substrate.

In one embodiment, the second temperature domain is a first cryogenic temperature and the third temperature domain is a second cryogenic temperature that is lower in temperature than the first cryogenic temperature. In another embodiment, the third temperature domain is a cryogenic temperature and the second temperature domain and the first temperature domain are non-cryogenic temperatures. In another embodiment, the first temperature domain is an ambient temperature. In one embodiment, the third temperature domain is a first cryogenic temperature domain at approximately 4K, the second temperature domain is a second cryogenic temperature at approximately 77K, and the first temperature domain is a non-cryogenic temperature at approximately 273K. In another embodiment, the first temperature domain is at approximately 298K.

In another embodiment, the first temperature domain has a first temperature range between approximately 310K (ambient+10 C) and approximately 271K (freezing point of sea water). In another embodiment, the first temperature range can be between approximately 310K (ambient+10 C) and approximately 252K (minimum freezing point of saltwater). Alternatively, the first temperature range can be between approximately 310K (ambient+10 C) and approximately 217K (triple point of CO2 (5.6 atm pressure)).

In one embodiment, the second temperature domain has a second temperature range between approximately 27K (boiling point of Ne) and any of the lower temperature limits of the first temperature range described above. In another embodiment, the second temperature range can be set at 9K or above or 19K or above.

In one embodiment, the third temperature domain has a third temperature range between approximately 4K and any of the lower temperature limits of the second temperature range described above. 4K is the boiling point of He. Alternatively, the lower temperature limit of the third temperature range can be set at approximately 3K (He3).

In another embodiment, the first temperature domain has a first temperature range with a lower temperature limit of approximately 273K (plus some margin), the second temperature domain has a second temperature range with a lower temperature limit of approximately 77K (plus some margin), and the third temperature domain has a third temperature range with a lower temperature limit of approximately 10K. The second temperature domain may be a cold range at 77K (plus some margin) because of the availability/cost of liquid nitrogen. The 77K range is thermally close to 10K range, so the negative affect on the signaling on the Link A channel (LINKA signaling) is minimized. The second temperature domain would not overlap with the cryogenic temperature range (third temperature domain), because then the buffer components would be at cryogenic temperatures (but the 4 W of power in the second temperature domain (buffer components) would need 880 W of cooling instead of 44 W. The first temperature domain may be a cool temperature range that starts at 273K (plus some margin) so water can be used as a coolant, (e.g., 100 m-deep sea water can server as an ambient). It should be noted that lower temperatures than 273K are possible for the first temperature domain (e.g., with Freon or some other refrigerant-coolant), but compression is now needed and there is not much benefit at the system level. Higher cool temperatures for the first temperature domain are possible, but there is more leakage to the cold/cryogenic domains and DRAM refresh may become a larger power component. It should be noted that the margin is the temperature drop needed so heat flows from a component to the cooling fluid. For example, the 77K buffer may actually be at 81K, so that the heat flows to the 77K liquid nitrogen coolant. The amount of margin may depend upon the thermal resistance of the heat path.

In one embodiment, the electronic system further includes a first interconnection coupled between the first component and the second component and a second interconnection coupled between the second component and the third component. The second interconnection may include at least one link upon which a signal is carried.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

The description above includes specific terminology and drawing symbols to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multiconductor signal links may alternatively be single-conductor signal links, and single conductor signal links may alternatively be multiconductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement. While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A computer system comprising:
   memory components in a first temperature domain;
   memory buffer components in a second temperature domain that is lower in temperature than the first temperature domain; and
   execution logic circuits in a third temperature domain that is lower in temperature than the second temperature domain.

2. The computer system of claim 1, wherein the third temperature domain has a cryogenic temperature range having an upper temperature limit set by an upper temperature limit of the execution logic circuits.

3. The computer system of claim 1, wherein the execution logic circuits reside on a processor integrated circuit.

4. The computer system of claim 1, wherein the execution logic circuits are quantum computing circuits.

5. The computer system of claim 4, wherein the execution logic circuits are digital circuits based on single-flux-quantum (SFQ) logic.

6. The computer system of claim 1, wherein the execution logic circuits are analog circuits.

7. The computer system of claim 1, wherein the third temperature domain has a cold temperature range having a lower temperature limit set by a cooling efficiency of the computer system.

8. The computer system of claim 1, wherein the first temperature domain has a cool temperature range having a lower temperature limit set by a cooling efficiency of a portion of the computer system, the portion comprising the memory components.

9. The computer system of claim 1, wherein the first temperature domain has a cool temperature range having a lower temperature limit set by an operating temperature range of the memory components.

10. The computer system of claim 1, wherein the memory components comprise a dynamic random access memory (DRAM) device, and wherein the first temperature domain has a cool temperature range having a lower temperature limit set by an operating temperature range of the DRAM device.

11. The computer system of claim 1, wherein the memory components comprise a dynamic random access memory (DRAM) device, and wherein the first temperature domain has a cool temperature range having an upper temperature limit set by a retention time of the DRAM device.

12. The computer system of claim 1, further comprising a coolant fluid circulation system to transfer heat generated by the memory components in the first temperature domain to a fluid medium.

13. The computer system of claim 12, wherein the fluid medium is sea water pumped from a moderate depth.

14. The computer system of claim 1, wherein the memory components comprise a standard dynamic random access memory (DRAM) device, wherein the first temperature domain corresponds to a normal commercial operating temperature range of the DRAM device.

15. The computer system of claim 1, wherein the memory buffer components are interposed between the memory components in the first temperature domain and the execution logic circuits in the third temperature domain, the second temperature domain serving as a thermal radiation shield for the third temperature domain from thermal conduction from the first temperature domain.

16. The computer system of claim 1, further comprising:
a first coolant fluid circulation system set at approximately a lower temperature limit of the first temperature domain;
a second coolant fluid circulation system set at approximately a lower temperature limit of the second temperature domain; and
a third coolant fluid circulation system set at approximately a lower temperature limit of the third temperature domain.

17. The computer system of claim 1, further comprising:
a first heat exchanger to transfer heat generated by the memory components in the first temperature domain to a first medium;
a second heat exchanger to transfer heat generated by the memory buffer components in the second temperature domain to a second medium; and
a third heat exchanger to transfer heat generated by the execution logic circuits in the third temperature domain to a third medium.

18. A computer system comprising:
memory circuits in a first temperature domain, wherein the memory circuits comprise at least one standard storage-class memory (SCM) component, wherein the first temperature domain corresponds to a normal commercial operating temperature range of the at least one SCM component;
buffer logic circuits in a second temperature domain that is lower in temperature than the first temperature domain; and
execution logic circuits in a third temperature domain that is lower in temperature than the second temperature domain.

19. The computer system of claim 18, wherein the SCM component comprises at least one of flash non-volatile memory, phase-changed memory (PCM), resistive random-access memory (RRAM or ReRAM), volatile memory, or non-volatile memory.

20. The computer system of claim 18, wherein the memory circuits comprises:
at least one dynamic random access memory (DRAM) component; and
at least one flash non-volatile memory (NVM) component, wherein contents of the at least one DRAM component are transferred to the at least one flash NVM component upon power failure of the computer system.

21. An electronic system comprising:
a first component in a first temperature domain, wherein the first temperature domain is a non-cryogenic temperature domain, wherein the first component is a memory component;
a second component in a second temperature domain that is lower in temperature than the first temperature domain, wherein the second component is a memory buffer component; and
a third component in a third temperature domain that is lower in temperature than the second temperature domain, wherein the third temperature domain is a cryogenic temperature domain.

22. The electronic system of claim 21, further comprising:
a first interconnection coupled between the first component and the second component; and
a second interconnection coupled between the second component and the third component, wherein the second interconnection comprises at least one link upon which a signal is carried, wherein a first segment of the at least one link is in the third temperature domain and a second segment of the at least one link is in a conducting state in the second temperature domain, wherein the second temperature domain is a first cryogenic temperature and the third temperature domain is a second cryogenic temperature that is lower in temperature than the first cryogenic temperature, wherein the third component is at least one of a controller component or a processor, wherein the at least one of the controller component or the processor is part of a cryogenic computer and the memory component and memory buffer component are part of a memory subsystem, wherein the memory subsystem comprises:
a plurality of Dynamic Random Access Memory (DRAM) devices disposed on a substrate; and
at least one flash non-volatile memory (NVM) device disposed on the substrate.

* * * * *